US008853708B2

(12) United States Patent
Haba

(10) Patent No.: US 8,853,708 B2
(45) Date of Patent: Oct. 7, 2014

(54) STACKED MULTI-DIE PACKAGES WITH IMPEDANCE CONTROL

(75) Inventor: Belgacem Haba, Saratoga, CA (US)

(73) Assignee: Tessera, Inc., San Jose, CA (US)

( * ) Notice: Subject to any disclaimer, the term of this patent is extended or adjusted under 35 U.S.C. 154(b) by 443 days.

(21) Appl. No.: 12/883,612

(22) Filed: Sep. 16, 2010

(65) Prior Publication Data
US 2012/0068361 A1 Mar. 22, 2012

(51) Int. Cl.
H01L 23/48 (2006.01)
H01L 21/50 (2006.01)
H01L 25/065 (2006.01)
H01L 23/31 (2006.01)
H01L 23/00 (2006.01)

(52) U.S. Cl.
CPC ............ *H01L 23/3121* (2013.01); *H01L 24/05* (2013.01); *H01L 2224/05553* (2013.01); *H01L 25/0657* (2013.01); *H01L 2224/85207* (2013.01); *H01L 2224/48227* (2013.01); *H01L 2224/24155* (2013.01); *H01L 2224/04026* (2013.01); *H01L 2224/24145* (2013.01); *H01L 2224/05555* (2013.01); *H01L 2225/0651* (2013.01); *H01L 2224/48091* (2013.01); *H01L 2924/3011* (2013.01); *H01L 23/3135* (2013.01); *H01L 2223/6611* (2013.01); *H01L 2924/01033* (2013.01); *H01L 24/24* (2013.01); *H01L 2924/01078* (2013.01); *H01L 2224/056* (2013.01); *H01L 2224/32225* (2013.01); *H01L 24/29* (2013.01); *H01L 24/06* (2013.01); *H01L 24/49* (2013.01); *H01L 2225/06524* (2013.01); *H01L 2224/73265* (2013.01); *H01L 2924/014* (2013.01); *H01L 2924/15311* (2013.01); *H01L 2224/49175* (2013.01); *H01L 24/48* (2013.01); *H01L 2924/01014* (2013.01); *H01L 2924/078* (2013.01)
USPC ............. 257/77; 257/666; 257/684; 257/685; 257/686; 257/692; 257/693; 257/698

(58) Field of Classification Search
CPC ..................... H01L 29/00; H01L 2224/47228; H01L 2224/73265; H01L 2224/32225; H01L 24/06; H01L 24/24; H01L 24/49; H01L 2924/00014
USPC .................. 257/724, 777, 783, 787, E21.499, 257/E23.01
See application file for complete search history.

(56) References Cited

U.S. PATENT DOCUMENTS 4,680,613 A 7/1987 Daniels et al.
4,980,753 A 12/1990 Dunaway et al.
(Continued)

FOREIGN PATENT DOCUMENTS

CN 101410974 A 4/2009
EP 0915504 A1 5/1999
(Continued)

OTHER PUBLICATIONS
Taiwan Office Action for Application No. 099107377 dated Feb. 18, 2013.
(Continued)

Primary Examiner — Matthew W Such
Assistant Examiner — David Spalla
(74) Attorney, Agent, or Firm — Lerner, David, Littenberg, Krumholz & Mentlik, LLP

(57) ABSTRACT

A microelectronic assembly may include microelectronic devices arranged in a stack and having device contacts exposed at respective front surfaces. Signal conductors having substantial portions extending above the front surface of the respective microelectronic devices connect the device contacts with signal contacts of an underlying interconnection element. A rear surface of a microelectronic device of the stack overlying an adjacent microelectronic device of the stack is spaced a predetermined distance above and extends at least generally parallel to the substantial portions of the signal conductors connected to the adjacent device, such that a desired impedance may be achieved for the signal conductors connected to the adjacent device.

26 Claims, 9 Drawing Sheets

(56) References Cited

U.S. PATENT DOCUMENTS

| | | | |
|---|---|---|---|
| 5,028,983 A | 7/1991 | Bickford et al. | |
| 5,065,282 A | 11/1991 | Polonio | |
| 5,343,074 A | 8/1994 | Higgins, III et al. | |
| 5,394,010 A | 2/1995 | Tazawa et al. | |
| 5,468,999 A | 11/1995 | Lin et al. | |
| 5,471,151 A | 11/1995 | DiFrancesco | |
| 5,523,621 A | 6/1996 | Kikuchi | |
| 5,552,631 A | 9/1996 | McCormick | |
| 5,606,196 A | 2/1997 | Lee et al. | |
| 5,638,596 A | 6/1997 | McCormick | |
| 5,639,989 A | 6/1997 | Higgins, III | |
| 5,835,988 A * | 11/1998 | Ishii | 257/684 |
| 5,880,403 A | 3/1999 | Czajkowski et al. | |
| 6,001,671 A | 12/1999 | Fjelstad | |
| 6,326,678 B1 | 12/2001 | Karnezos et al. | |
| 6,445,594 B1 | 9/2002 | Nakagawa et al. | |
| 6,476,506 B1 | 11/2002 | O'Connor et al. | |
| 6,518,659 B1 | 2/2003 | Glenn | |
| 6,538,336 B1 | 3/2003 | Secker et al. | |
| 6,552,417 B2 | 4/2003 | Combs | |
| 6,667,546 B2 | 12/2003 | Huang et al. | |
| 6,770,822 B2 | 8/2004 | Pasternak et al. | |
| 6,812,580 B1 | 11/2004 | Wenzel et al. | |
| 7,166,495 B2 * | 1/2007 | Ball | 438/109 |
| 7,205,651 B2 * | 4/2007 | Do et al. | 257/706 |
| 7,217,997 B2 | 5/2007 | Wyland | |
| 7,303,113 B2 | 12/2007 | Kwark et al. | |
| 7,450,110 B2 | 11/2008 | Shahoian et al. | |
| 7,456,505 B2 | 11/2008 | Gospodinova et al. | |
| 7,466,021 B2 | 12/2008 | Fjelstad | |
| 7,468,560 B2 | 12/2008 | Guengerich et al. | |
| 7,528,011 B2 | 5/2009 | Yano et al. | |
| 7,537,962 B2 | 5/2009 | Jang et al. | |
| 7,723,852 B1 * | 5/2010 | Kim et al. | 257/777 |
| 7,727,801 B2 | 6/2010 | Saran | |
| 7,768,135 B1 * | 8/2010 | St. Amand et al. | 257/777 |
| 7,923,851 B2 | 4/2011 | Haba et al. | |
| 8,026,129 B2 * | 9/2011 | Cablao et al. | 438/109 |
| 8,222,725 B2 | 7/2012 | Haba et al. | |
| 8,237,250 B2 | 8/2012 | Chang Chien et al. | |
| 8,243,465 B2 | 8/2012 | Itaya et al. | |
| 8,253,258 B2 | 8/2012 | Sonobe et al. | |
| 8,294,249 B2 | 10/2012 | Pilling et al. | |
| 2001/0015490 A1 | 8/2001 | Lee | |
| 2003/0090001 A1 | 5/2003 | Beatson et al. | |
| 2004/0164389 A1 | 8/2004 | Lee | |
| 2004/0238939 A1 | 12/2004 | Wu | |
| 2005/0006742 A1 | 1/2005 | Sugiyama et al. | |
| 2005/0045378 A1 | 3/2005 | Heng et al. | |
| 2005/0098870 A1 | 5/2005 | Thomas et al. | |
| 2005/0116013 A1 | 6/2005 | Kwark et al. | |
| 2006/0049505 A1 | 3/2006 | Wyland | |
| 2006/0125079 A1 | 6/2006 | Wyland et al. | |
| 2006/0131742 A1 | 6/2006 | Tzu | |
| 2006/0145308 A1 | 7/2006 | Floyd et al. | |
| 2006/0175712 A1 | 8/2006 | Lyn et al. | |
| 2006/0180916 A1 | 8/2006 | Wyland | |
| 2007/0007644 A1 | 1/2007 | Zhao et al. | |
| 2007/0034674 A1 | 2/2007 | Mii et al. | |
| 2007/0105272 A1 | 5/2007 | Lee et al. | |
| 2007/0170601 A1 | 7/2007 | Miyaki et al. | |
| 2008/0088012 A1 | 4/2008 | Ohkawa | |
| 2008/0111248 A1 | 5/2008 | Foong et al. | |
| 2009/0256266 A1 | 10/2009 | Lao et al. | |
| 2010/0230828 A1 | 9/2010 | Haba et al. | |
| 2010/0232128 A1 | 9/2010 | Haba et al. | |
| 2010/0270667 A1 | 10/2010 | Tong et al. | |
| 2012/0068317 A1 | 3/2012 | Haba et al. | |
| 2012/0068338 A1 | 3/2012 | Haba et al. | |
| 2012/0068361 A1 | 3/2012 | Haba | |

FOREIGN PATENT DOCUMENTS

| | | |
|---|---|---|
| EP | 1770777 A2 | 4/2007 |
| JP | 06-268100 A | 9/1994 |
| JP | 7058138 A | 3/1995 |
| JP | 9-027512 A | 1/1997 |
| JP | 2000021926 A | 1/2000 |
| JP | 2000332160 A | 11/2000 |
| JP | 2001007140 A | 1/2001 |
| JP | 2001339016 A | 12/2001 |
| JP | 2004112143 A | 4/2004 |
| JP | 2006216823 A | 8/2006 |
| KR | 100270817 B1 | 11/2000 |
| KR | 20050002659 A | 1/2005 |
| KR | 100702970 A | 1/2007 |
| KR | 100935854 B1 | 1/2010 |
| KR | 100950511 B1 | 3/2010 |
| WO | 2005010989 A1 | 2/2005 |
| WO | 2008/008948 A2 | 1/2008 |
| WO | 2010020836 A1 | 2/2010 |

OTHER PUBLICATIONS

International Search Report Application No. PCT/US2010/027135, dated Aug. 30, 2011.
International Search Report, PCT/US2010/027141, dated Jan. 6, 2012.
Partial International Search Report and Invitation to Pay Additional Fees, PCT/US2010/027135, dated Mar. 21, 2011.
Partial International Search Report and Invitation to Pay Additional Fees, PCT/US2010/027141, dated Jan. 27, 2011.
U.S. Appl. No. 12/883,821.
U.S. Appl. No. 12/883,811.
U.S. Appl. No. 12/883,556.
Chinese Office Action for Application No. 201080020828.3 dated Jul. 29, 2013.
Japanese Office Action for Application No. 2011-554234 dated Jul. 10, 2013.
Chinese Office Action for Application No. 201080020851.2 dated Nov. 28, 2013.
Japanese Office Action for Application No. 2011-554232 dated Feb. 4, 2014.
Chinese Office Action for Application No. 201080020828.3 dated Mar. 3, 2014.

* cited by examiner

STACKED MULTI-DIE PACKAGES WITH IMPEDANCE CONTROL

BACKGROUND OF TEE INVENTION

Microelectronic chips are typically flat bodies with oppositely facing, generally planar front and rear surfaces with edges extending between these surfaces. Chips generally have contacts, sometimes also referred to as pads or bond pads, on the front surface which are electrically connected to the circuits within the chip. Chips are typically packaged by enclosing them with a suitable material to form microelectronic packages having terminals that are electrically connected to the chip contacts. The package may then be connected to test equipment to determine whether the packaged device conforms to a desired performance standard. Once tested, the package may be connected to a larger circuit (e.g. a circuit in an electronic product such as a computer or a cell phone) by connecting the package terminals to matching lands on a printed circuit board (PCB) by a suitable connection method such as soldering.

Microelectronic packages may be fabricated at the wafer level; that is, the enclosure, terminations and other features that constitute the package, are fabricated while the chips, or die, are still in a wafer form. After the die have been formed, the wafer is subject to a number of additional process steps to form the package structure on the wafer, and the wafer is then diced to free the individually packaged die. Wafer level processing can be an efficient fabrication method because the footprint of each die package may be made identical, or nearly identical, to the size of the die itself, resulting in very efficient utilization of area on the printed circuit board to which the packaged die is attached.

A common technique for forming electrically conductive connections between a microelectronic chip and one or more other electronic components is through wire-bonding. Conventionally, a wirebonding tool attaches the end of a wire to a pad on a microelectronic chip using thermal and/or ultrasonic energy and then loops the wire to a contact on the other electronic component and forms a second bond thereto using thermal and/or ultrasonic forces.

In microelectronic assemblies that include wire-bonds extending from the microelectronic chip to another electronic component, electromagnetic transmissions along the wire can extend into space surrounding the wire, inducing currents in nearby conductors and causing unwanted radiation and detuning of the line. Wire-bonds generally are also subject to self-inductances and are subject to external noise (e.g. from nearby electronic components). In the end, this creates electrical impedance problems. These problems can become more serious as the pitch between contacts on microelectronic chips and other electronic components becomes smaller, as the chips operate at higher frequencies, and as the use of multiple raw pads becomes more common.

SUMMARY OF TEE INVENTION

In accordance with an embodiment of the invention, a microelectronic assembly may include a plurality of microelectronic devices arranged to form a stack of microelectronic devices. Adjacent first and second microelectronic devices in the stack each may have device contacts exposed at a front surface, and have a rear surface remote from the front surface. The assembly further may include an interconnection element underlying the second microelectronic device, the interconnection element having a plurality of signal contacts. First and second signal conductors respectively may connect the device contacts of the first and second devices with the signal contacts. The first and second signal conductors may have substantial portions extending above the front surfaces of the respective first and second microelectronic devices. The rear surface of the first microelectronic device may be spaced a predetermined first distance above and extend at least generally parallel to the substantial portions of the second signal conductors, such that a desired impedance is achieved for the second signal conductors.

In accordance with another embodiment of the invention, a method of fabricating a microelectronic assembly may include arranging a plurality of microelectronic devices in a stack including a first microelectronic device mounted above an adjacent second microelectronic device. The first and second microelectronic devices in the stack may have device contacts exposed at a front surface, and have a rear surface remote from the front surface. The method further may include connecting the device contacts of the first and second devices with signal contacts of an interconnection element, which underlies the second device, using respective first and second signal conductors. The second signal conductors may be connected to the signal contacts before the first signal conductors are connected to the signal contacts. The first and second signal conductors may have substantial portions extending above the front surfaces of the respective first and second microelectronic devices. The rear surface of the first microelectronic device may be spaced a predetermined first distance above and extend at least generally parallel to the substantial portions of the second signal conductors, such that a desired impedance is achieved for the second signal conductors.

In accordance with another embodiment of the invention, a method of fabricating a microelectronic assembly may include arranging a plurality of microelectronic devices in a stack over an interconnection element. Adjacent first and second microelectronic devices in the stack may have device contacts exposed at a front surface, and have a rear surface remote from the front surface, and the interconnection element may underlie the second microelectronic device. The device contacts of the first and second devices may be connected with signal contacts of the interconnection element by respective first and second signal conductors, where the second signal conductors are connected to the signal contacts before the first signal conductors are connected to the signal contacts. The first and second signal conductors may have substantial portions extending above the front surfaces of the respective first and second microelectronic devices. The rear surface of the first microelectronic device may be spaced a predetermined first distance above and extend at least generally parallel to the substantial portions of the second signal conductors, such that a desired impedance is achieved for the second signal conductors and empty spaces are defined between the first and second microelectronic devices. The method may further include injecting dielectric material into the empty spaces between the first and second microelectronic devices.

BRIEF DESCRIPTION OF TEE DRAWINGS

DETAILED DESCRIPTION

Figure 1A:
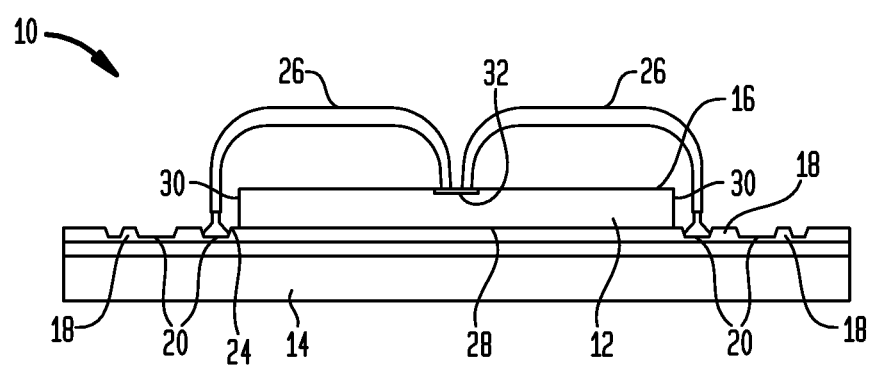
FIGS. 1A-1E are sectional views illustrating stages in a method of fabricating a microelectronic assembly, in accordance with an embodiment of the invention.

A method of fabricating a microelectronic assembly 10, in accordance with an embodiment of the invention, is described with reference to sectional views illustrating respective stages of fabrication in FIGS. 1A-1E. As discussed in detail below, in this example, the microelectronic assembly 10 may include one or more microelectronic devices 12 having conductive interconnections, such as through wire bonds, to an element 14 having an interconnection function. The wire-bonds may be formed using conventional wire-bonding techniques. For explanation purposes, the microelectronic device 12 may be a single "bare", i.e., unpackaged die, e.g., a semiconductor chip having microelectronic circuitry thereon. In alternative embodiments, the microelectronic device 12 can include a packaged semiconductor die, or other unit including one or more semiconductor dies, each typically having active semiconductor devices thereon.

For ease of reference, directions are stated in this disclosure with reference to a "top" or front, i.e., contact-bearing surface 16, of the microelectronic device 12. Generally, directions referred to as "upward" or "rising from" shall refer to the direction orthogonal and away from the device front surface 16. Directions referred to as "downward" shall refer to the directions orthogonal to the device front surface 16 and opposite the upward direction. The term "above" a reference point shall refer to a point upward of the reference point, and the term "below" a reference point shall refer to a point downward of the reference point. The "top" of any individual element shall refer to the point or points of that element which extend furthest in the upward direction, and the term "bottom" of any element shall refer to the point or points of that element which extend furthest in the downward direction.

Referring to FIG. 1A, the interconnection element 14 may be an element of a package having a plurality of conductive leads or traces 18, and a plurality of signal contacts 20 connected to the leads or traces and arranged generally at first locations for interconnection with a microelectronic device.

In the example illustrated in FIGS. 1A-1E, the contacts 20 can carry signals, i.e., voltages or currents which vary with time and which typically convey information. For example, without limitation, voltages or currents which vary with time and which represent state, change, a measurement, a clock or timing input or a control or feedback input are examples of signals.

As used in this disclosure, a statement that an electrically conductive structure is "exposed at" a surface of a dielectric structure indicates that the electrically conductive structure is available for contact with a theoretical point moving in a direction perpendicular to the surface of the dielectric structure toward the surface of the dielectric structure from outside the dielectric structure. Thus, a conductive structure which is exposed at a surface of a dielectric structure may project from such surface; may be flush with such surface; or may be recessed relative to such surface and exposed through a hole or depression in the dielectric.

In one particular embodiment, the interconnection element 14 may be or may include a "substrate", e.g., a dielectric element bearing a plurality of traces and bond pads. Without limitation, one particular example of a substrate can be a sheet-like flexible dielectric element, typically made of a polymer, e.g., polyimide, among others, having metal traces and bond pads patterned thereon, the bond pads being exposed at least one face of the dielectric element.

The microelectronic device 12 includes a rear surface remote from the front surface 16, and opposing edges 30 extending between the front surface 16 and the rear surface 28. In one embodiment, the opposing edges 30 of the device 12 may be spaced about 10 mm from each other, and the spacing between the front surface and rear surface of the device 12, or the thickness of the device 12, may be less than about one micron.

Prior to forming conductive interconnections between the microelectronic device 12 and the interconnection element 14, the contacts 20 are exposed at an outwardly-directed or top face 24 of the interconnection element 14. In addition, the device 12 is mounted on the interconnection element 14 with the rear surface 28 of the device 12 facing the top face 24 of the interconnection element 14.

Referring to FIG. 1A, a wire bond 26 or signal conductor extends from a device contact 32 at a location remote from the edges 30 of the microelectronic device 12, such as from a device contact at a portion of the device 12 located centrally between the edges 30, parallel to or substantially parallel to, the front surface 14 toward one of the edges 30. The wire bond or signal conductor 26 conductively connects a device contact 32 at the front surface 16 of the microelectronic device 12 with a contact 20 exposed at the top surface 24 of the interconnection element 14. Wire bonds 26 can be formed with relatively precise placement and within desirable tolerances such that parallel, closely spaced runs can be achieved. For example, wirebonding equipment available from Kulicke and Soffa can be used to achieve precision wire bonds. See, for example, U.S. application Ser. No. 12/722,799, filed Mar. 12, 2010, incorporated by reference herein.

In one embodiment, the signal conductor 26 may be insulated using a dielectric material, for example, by dispensing dielectric material over the signal conductor 26 and thereafter curing the material to form an encapsulant on the signal conductor 26.

Figure 1B:
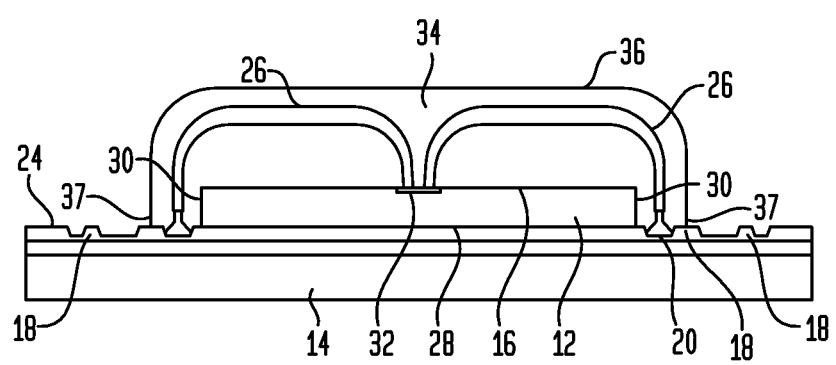

Referring to FIG. 1B, a support element 34 having a top surface 36 can be formed above the signal conductors 26. The support element 34 can extend from the top surface 24 of the interconnection element 14. The top surface 36 extends at least substantially parallel to the runs of the signal conductors 26 above the front surface 16 and can extend substantially parallel to the front surface 16 of the device 12. The support element 34 desirably leaves at least some of the contacts 20 on the interconnection element 14 exposed beyond edges 37 of the support element 34 which are adjacent to the edges 30 of the device 12. In one embodiment, the support element 34 can include dielectric material, and may be formed so as to encapsulate the signal conductors 26 connected to the contacts 32 at the front surface 16 of the device 12.

Figure 1C:
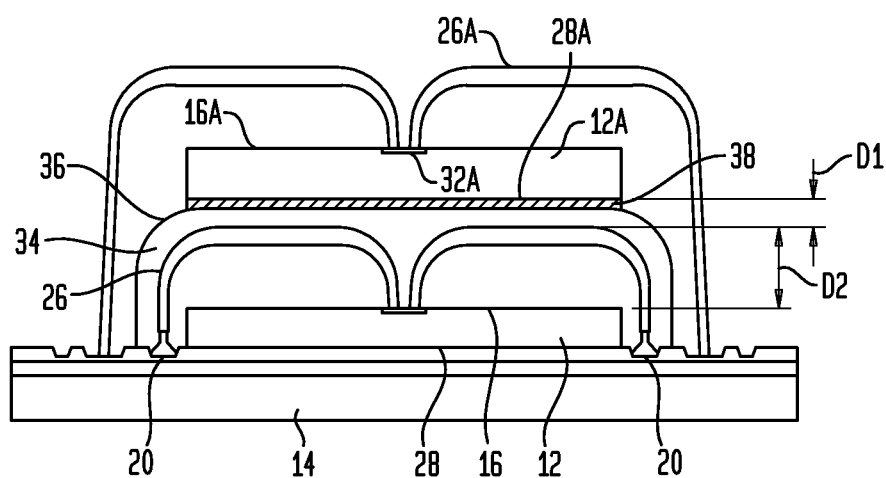

Referring to FIG. 1C, a microelectronic device 12A may be mounted over the top surface 36 of the support element 34 using a layer of adhesive 38, so the devices 12, 12A are arranged on top of each other in the form of a stack. Signal conductors 26A can then be formed using wire bonds, similarly as described above for the device 12, to connect signal contacts 20 on the interconnection element 14 to device contacts 32A on the top surface 16A of the device 12A. The adhesive 38 may be of the type and applied as described, for example, in U.S. Pat. Nos. 5,980,663 and 6,646,289, incorporated by reference herein.

The device 12A may be mounted such that a conductive or semiconducting rear surface 28A of the device 12A extends at least generally parallel to substantial portions of respective lengths of the signal conductors 26 which extend above the front surface 16 of the underlying device 12. In addition, the device 12A may be mounted so that the rear surface 28A is spaced a predetermined distance D1 from the signal conductors 26 connected to the underlying device 12, in order to achieve a selected characteristic impedance for the signal conductors 26. In this way, the rear surface 28A of the device 12A serves as a reference conductor or conductive plane to the signal conductors 26, thereby forming transmission lines which include the respective signal conductors and the device rear surface 28A. The properties of the metal used in the signal conductors 26, the shape and thicknesses of the wires that form the signal conductors 26 and the spacing between the rear surface 28A of the device 12A and the signal conductors 26, contribute to provide a desired characteristic impedance for the signal conductors 26. In one embodiment, these factors and the separation distance D1 may be selected to achieve a characteristic impedance of about 50 ohms for the signal conductors. In another embodiment, these factors may be selected in relation to the distance D1, which may be selected to be about 30-70 microns, to achieve a characteristic impedance of about 50 ohms for the signal conductors.

Based on the geometry of the assembly 10, the characteristic impedance $Z_0$, in ohms, for the signal conductors connected to the microelectronic device 12 varies in relation to the separation distance D1 between the signal conductors 26 and the rear surface 28A of the microelectronic device 12A. The characteristic impedance $Z_0$ may be determined using the equation:

$$Z_0 = \frac{138 \times \log(4H/d)}{\sqrt{\varepsilon_R}} \text{ ohms,}$$

where H is the separation distance between the signal conductors 26 and the conductive plane defined by the device 12A, d is the diameter of the wire and $\varepsilon_R$ is the permeability of the space between the conductors 26 and the device 12A, where the space includes the dielectric material of the support element 34 separating the conductors (wire) 26 from the conductive plane defined by the device 12A. See U.S. application Ser. No. 12/722,799, filed Mar. 12, 2010, incorporated by reference herein, for a detailed discussion of determining characteristic impedance for wirebond signal conductors in a microelectronic assembly having a geometry similar to that of the assembly 10.

In one embodiment, the device 12A may be arranged such that the rear surface 28A extends generally parallel to portions of the signal conductors 26 which extend above the front surface 16 of the device 12 and have lengths of at least one millimeter. In a further embodiment, the lengths of the portions of the signal conductors 26 above which the rear surface 28A extends are at least twenty-five percent of the total lengths of the respective signal conductors 26.

In one embodiment, a separation distance D2 separates the signal conductors 26 and the front surface 16 of the device 12, and D2 may be equal to or exceed D1. The separation distance D2 between the device 12 and its signal conductors 26 desirably is greater than the separation distance D1 between the signal conductors 26 and the overlying device 12A, which serves as a reference conductor for the signal conductors 26. In this way, the arrangement between the signal conductors 26 and the device 12A contributes more to the characteristic impedance for the signal conductors 26 than the arrangement of the signal conductors 26 relative to the device 12. In one embodiment, D2 may exceed D1 by at least about 25 microns.

Figure 1D:
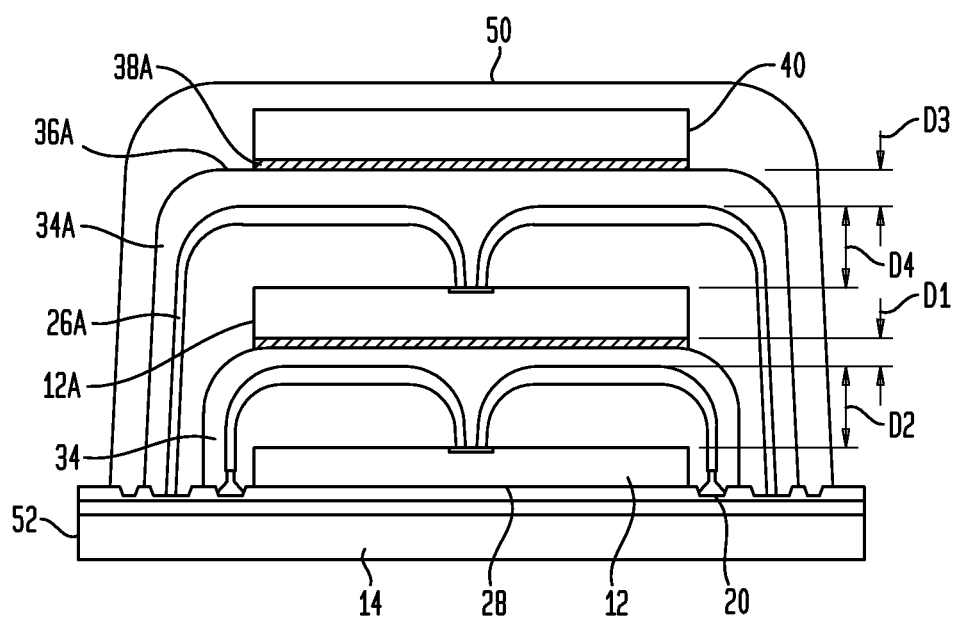

Referring to FIG. 1D, a support element 34A may be formed over the conductors 26A of the device 12A, similarly as described above for the support element 34, and then a reference conductive element may be formed on the support element 34A. The reference conductive element can be a sheet-like dielectric element 40 having one or more conductive features thereon, such as a conductive plane or a plurality of spaced conductive strips. Alternatively, referring to FIG. 1E, the reference conductive element can be a metal sheet 56.

In a particular embodiment, referring to FIG. 1D, the reference conductive element may be in the form of a substrate 40 including silicon material, such as used to form a microelectronic device, and the substrate 40 may be attached to top surface 36A of the support element 34A using a layer of adhesive 38A. The reference conductive element 40 is spaced a separation distance D3 from the conductors 26A. In this way, the reference conductive element 40 serves as a conductive plane of transmission lines which include the respective conductors 26A to achieve a desired characteristic impedance thereon. Advantageously, in the assembly 10 according to the present invention, each of the device 12A and the reference conductive element 40 functions as an independent or so-called floating conductive plane, to achieve a desired impedance for the signal conductors connected to and running across the top surface of the adjacent, underlying microelectronic device.

In one embodiment, the conductors 26A desirably are spaced a separation distance D4 from the device 12A, where D4 exceeds D3. In alternative embodiments, D1 and D3 may or may not be equal, and D2 and D4 may or may not be equal.

Figure 1E:
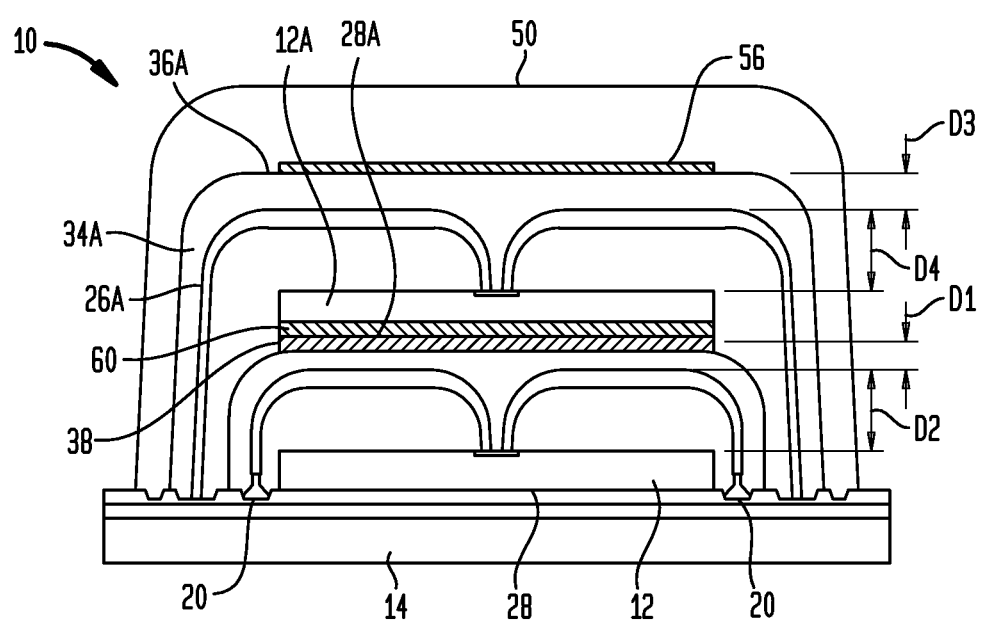

Referring to FIGS. 1D-1E, an encapsulant layer 50 of dielectric material may be formed to encapsulate the reference conductive element and the underlying microelectronic devices 12 in the stack.

In another embodiment, referring to FIG. 1E, the device 12A may include a layer of metal 60 at the rear surface 28A. The metal layer 60 may be laminated to the device 12A, or formed on the device 12A by sputtering, deposition, lamination or the like. Typically, the metal layer is continuous and covers at least substantially all of the rear surface 28A. However, the metal layer may extend on only portions of the rear surface 28A, or may include openings to permit other conductors to contact specific parts of the device 12A. The metal layer may have a thickness from about 100 angstroms to about 100 microns. When the metal layer is formed by sputtering or a chemical or physical vapor deposition process, the thickness can range from about 100 angstroms to about 5 microns. When the metal layer is formed by other means, for example, by plating or as a metal sheet laminated to the surface of the microelectronic device, the thickness can range from about 5 microns to about 100 microns. The thickness of the metal layer 60 may be a substantially small percentage of the entire thickness of the device 12A, such as up to about 50% of the thickness of the entire thickness of the device 12A, because the portion of the device 12A other than the metal layer 60 typically has conductive properties that contribute significantly to the characteristic impedance that may be achieved for the signal conductors 26.

It is to be understood that a microelectronic assembly, in accordance with the present invention, may have more than two microelectronic devices arranged in a stack, for example, up to sixteen or more microelectronic devices. In such assembly, a reference conductive element may be supported a predetermined separation distance above the signal conductors connected to the top microelectronic device in the stack to achieve a desired impedance for the signal conductors connected to the top device, and one or more microelectronic device of the stack may be supported a predetermined distance above the signal conductors connected to the respective adjacent, underlying microelectronic device to achieve respective desired impedances for the signal conductors connected to the adjacent, underlying microelectronic devices.

Figure 2A:
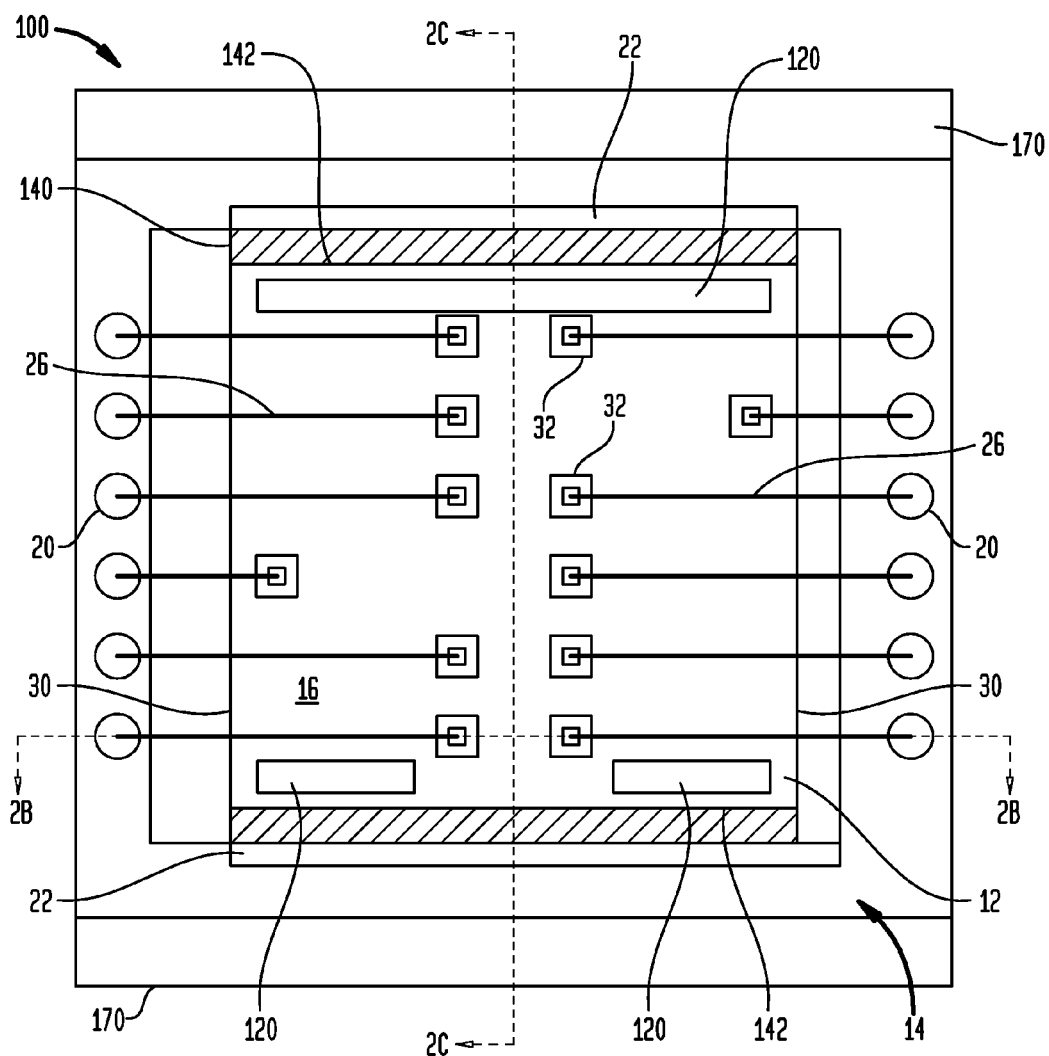
FIG. 2A is a plan view of a microelectronic assembly, in accordance with another embodiment of the invention.
Figure 2B:
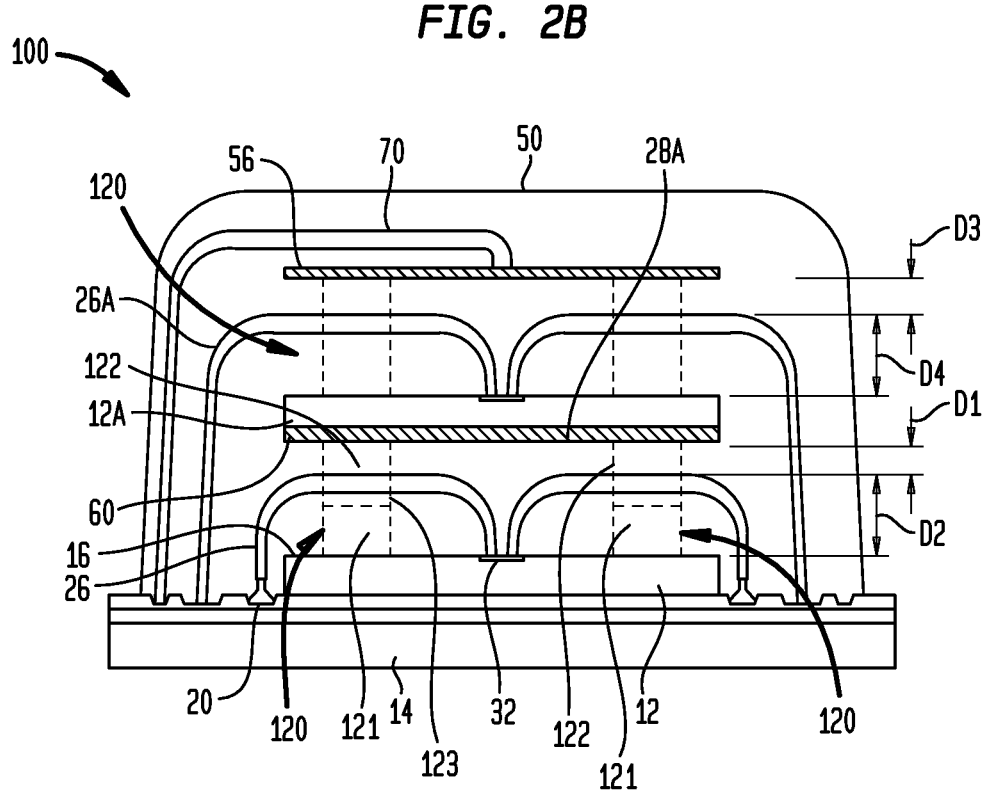
FIG. 2B is a sectional view of the microelectronic assembly of FIG. 2A at line 2B-2B.

FIG. 2A is a plan view from above of a microelectronic assembly 100, in accordance with another embodiment of the present invention, before a reference conductor is arranged over wirebond signal conductors 26 that run over the top surface of a microelectronic device 12, which is mounted to an interconnection element 14. The assembly 100 includes elements arranged in a construction similar to the construction of the assembly 10, and like reference numerals designate the same or similar elements. FIG. 2B is a sectional view of the assembly 100, at cross-sectional line 2B-2B as shown in FIG. 2A, following fabrication steps that provide that the microelectronic device 12A, which includes a metal layer 60 at the rear surface 28A, is supported over the device 12 and the reference conductive element 56 is supported over the device 12A. Referring to FIGS. 2A-2B, the assembly 100 may include spacer elements 120 extending vertically between adjacent microelectronic devices in the stack, and vertically between the top microelectronic device in the stack and the reference conductive element overlying the top device, so as to space the reference conductive element a precise separation distance from the signal conductors connected to the top device and also to space the top device 12A a precise separation distance from the signal conductors connected to the underlying device 12. The spacer elements are typically formed from dielectric material, so as to avoid any contribution by the spacer element to the characteristic impedance for the signal conductors. In an embodiment, the spacer elements may be fabricated similar to that in which standoff walls of lidded image sensor packages can be fabricated, such as described in U.S. Patent Publ. No. 2007/0190747, incorporated by reference herein.

Referring to FIG. 2B, in one embodiment, the device 12A is supported on spacer elements 120, which include a first portion 121 and a second portion 122, and the spacer elements 120 space the rear surface 28A of the device 12A a separation distance D1 from the conductors 26 connected to the device 12. In one embodiment, the spacer elements 120 may extend vertically from the top surface 16 of the device 12 to the rear surface 28A of the device 12A, which is the rear surface of a metal layer 60 formed at the rear surface 28A of the device 12A. The separation distance D1 achieves the desired characteristic impedance for the conductors 26. In addition, the spacer elements 120 are adapted so that a separation distance D2, which is greater than D1, is provided between the conductors 26 and the device 12, to avoid contribution of the device 12 to the characteristic impedance for the conductors 26.

Other than the use of spacer elements to support a microelectronic device or the reference conductive element above an adjacent, underlying microelectronic device, so as to provide a precise separation distance between the signal conductor connected to the underlying device and the above microelectronic device or reference conductive element, the fabrication of the assembly 100 may be substantially the same as described above for the assembly 10 with respect to FIGS. 1A-1E.

The fabrication of the assembly 100 using the spacer elements 120 can result in empty spaces existing between adjacent devices in the stack and between the top device in the stack and the reference conductive element. In one embodiment, when the encapsulant 50 is formed over the reference conductive element and the stack of microelectronic devices, encapsulant material may be injected to fill empty spaces between adjacent microelectronic devices in the stack, and between the reference conductive element and the top microelectronic device in the stack.

In one embodiment, the spacer elements 120 include a first adhesive portion 121 and a second adhesive portion 122. During fabrication of the assembly 100, the device 12 having the first adhesive portion 121 on the top surface 16 is provided, the signal conductors 26 are connected to the device contacts of the device 12 and then the device 12A with the second adhesive portion 122 on the rear surface 28A is arranged over the device 12, such that the first and second portions 121, 122 align with and contact each other. The contacting adhesive portions are then cured to form the spacer element 120, which fixedly spaces the devices 12, 12A from each other, and thus fixedly spaces, with great precision, the signal conductors connected to the device 12 a separation distance D1 from the rear surface 28A of the device 12A.

In one embodiment, the spacer elements 120 may be disposed so that the first and second adhesive portions are respectively below and above the conductors 26. Alternatively, the spacer elements may be disposed outside of the region of the assembly where the conductors 26 run.

In another embodiment, a spacer element may include an intermediate portion 123 formed from dielectric or silicon material. Opposing ends of the intermediate portion 123 may terminate in adhesive portions 121 and 122 that adhesively connect the spacer element, respectively, to the rear surface of the device 12A and the front surface of the adjacent device 12.

In one embodiment, the first portion of the spacer element is a curable adhesive material formed on the front surface of a microelectronic device during manufacture thereof.

In a further embodiment, the first and second portions of the spacer element may include curable adhesive material and be formed respectively on the front and rear surface of a microelectronic device during manufacture thereof. Such microelectronic device may then readily be included in a stack of devices, above another microelectronic device in the stack.

In another embodiment, during fabrication of the microelectronic assembly 100, the spacer element, which may be made entirely of adhesive material, may be formed on the top surface of the microelectronic device that is currently the top device in a stack of microelectronic devices. Then, a microelectronic device or reference conductive element, which is to overlie the current top device in the completely fabricated microelectronic assembly, may be placed on top of the current top device. Curing may then be performed to provide that the adjacent components are secured to each other by the spacer element.

Figure 2C:
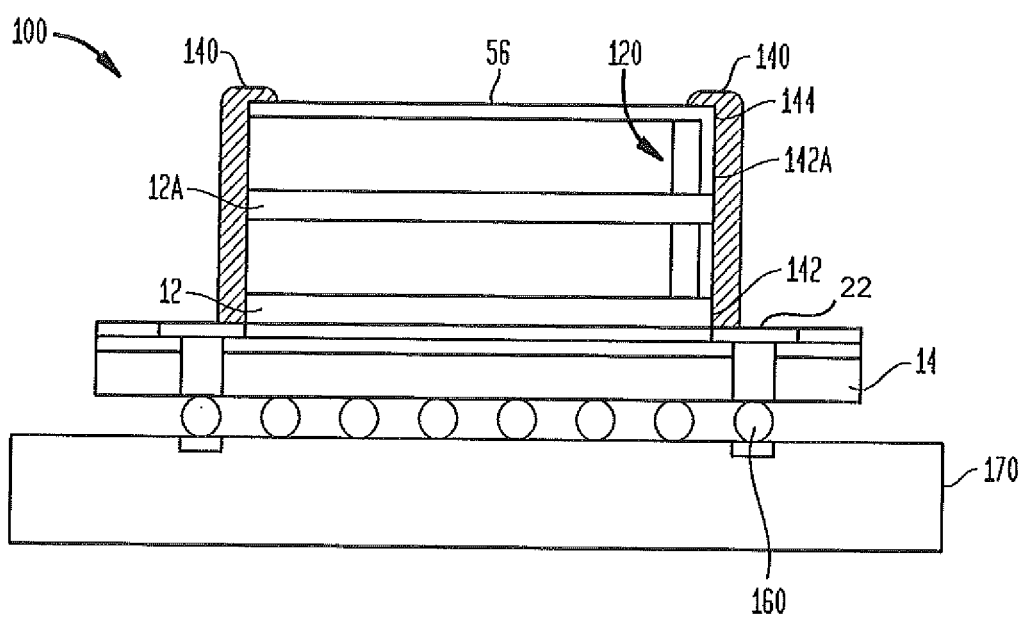
FIG. 2C is a sectional view of the microelectronic assembly of FIG. 2A at line 2C-2C.

Referring to FIGS. 2A, 2B and 2C, the microelectronic devices of the assembly 100 may include exposed opposing edge surfaces 142 which extend between front and rear surfaces thereof. In addition, the reference conductive element 56 may include exposed opposing edge surfaces 144 extending parallel to or aligned with the exposed edge surfaces 142. In one embodiment, masking or like damming techniques may be utilized when the encapsulant 50 is formed over the reference conductive element 56 and the stack of microelectronic devices, so as to provide that the edge surfaces 142 and 144 remain exposed after formation of the encapsulant 50. The assembly 100 may include a conductive interconnecting element 140 that contacts, and interconnects to one another, the exposed edge surfaces 142 of the devices 12 and the exposed edge surfaces 144 of the reference conductive element 56. The conductive interconnecting element 140 may be an electrically conductive paste or solder, and extend in a direction generally orthogonal to a plane in which the devices 12 and the reference conductive element 56 extend.

In alternative embodiments, the conductive element 140 may be provided in a microelectronic assembly to conductively interconnect the exposed edge surface of the reference conductive element to one or more respective exposed edge surfaces of the devices in the stack, or to conductively interconnect two or more exposed edge surfaces of the devices in the stack.

In a further embodiment, the conductive element 140 may be connected to an exposed reference contact 22 arranged at the top surface 24 of the interconnection element 14. The contact 22 is for interconnection to another element, such as, for external interconnection to a printed circuit board. Referring to FIG. 2C, the contact 22 may be connected to a conductive trace extending through the thickness of the element 14 and terminating at a contact at the rear surface of the interconnection element 14, where a connection may be made to a solder bump 160 of a substrate assembly 170 on which the interconnection element 14 is mounted. The assembly 170 may, for example, be a printed circuit board or circuit panel. The solder bump 160 may be connectable with a source of power or ground via a conductive trace in the assembly 170. A connection to ground or a power supply voltage typically provides a reference in a circuit to a voltage which is at least fairly stable with time over frequencies of interest to the operation of the circuit. By connecting the conductor planes of the assembly 100, namely, the devices 12, 12A and the reference conductive element 56, to a reference, a transmission line structure may be achieved which has a beneficial characteristic impedance, because the devices 12 and the reference conductive element 56 of the assembly 100 are at the same potential. The reference conductive element and the devices 12, thus, may function as reference conductors having a fixed potential, such that the characteristic impedances achieved for the signal conductors of the respective devices 12 of the assembly 100 may be maintained at a relatively constant value.

In a further embodiment of the assembly 100 in which the reference conductive element 56 and the devices 12, 12A are not electrically interconnected to one another at their respective exposed edge surfaces, one or more wire bonds 70 may extend from the reference conductive element 56 and connect to a contact on the interconnection element 14. In turn, the interconnection element 14 can be connected to a reference potential, such as through further interconnection between a terminal of the interconnection element 14 and a circuit panel.

The foregoing embodiments have been described with respect to the interconnection of individual microelectronic devices, e.g., semiconductor chips. However, it is contemplated that the methods described herein may be employed in a wafer-scale manufacturing process applied simultaneously to a plurality of chips connected together at edges of the chips, such as a plurality of chips connected together at edges in form of a unit, panel, wafer or portion of a wafer.

Figure 3:
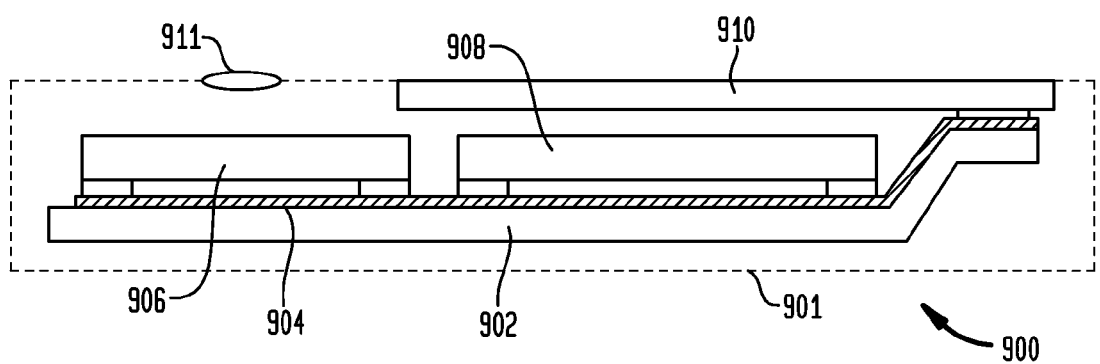
FIG. 3 is a schematic depiction of a system according to one embodiment of the invention.

The structures discussed above can be utilized in construction of diverse electronic systems. For example, a system 900 in accordance with a further embodiment of the invention includes a structure 906, such as the microelectronic assemblies 10 and 100 described above, in conjunction with other electronic components 908 and 910. In the example depicted, component 908 is a semiconductor chip whereas component 910 is a display screen, but any other components can be used. Of course, although only two additional components are depicted in FIG. 3 for clarity of illustration, the system may include any number of such components. The structure 906 as described above may be, for example, a composite chip or a structure incorporating plural chips. In a further variant, both may be provided, and any number of such structures may be used. Structure 906 and components 908 and 910 are mounted in a common housing 901, schematically depicted in broken lines, and are electrically interconnected with one another as necessary to form the desired circuit. In the exemplary system shown, the system includes a circuit panel 902 such as a flexible printed circuit board, and the circuit panel includes numerous conductors 904, of which only one is depicted in FIG. 3, interconnecting the components with one another. However, this is merely exemplary; any suitable structure for making electrical connections can be used. The housing 901 is depicted as a portable housing of the type usable, for example, in a cellular telephone or personal digital assistant, and screen 910 is exposed at the surface of the housing. Where structure 906 includes a light-sensitive element such as an imaging chip, a lens 911 or other optical device also may be provided for routing light to the structure. Again, the simplified system shown in FIG. 3 is merely exemplary; other systems, including systems commonly regarded as fixed structures, such as desktop computers, routers and the like can be made using the structures discussed above.

While the above description makes reference to illustrative embodiments for particular applications, it should be understood that the claimed invention is not limited thereto. Those having ordinary skill in the art and access to the teachings provided herein will recognize additional modifications, applications, and embodiments within the scope of the appended claims.

The invention claimed is:

1. A microelectronic assembly comprising:
a plurality of microelectronic devices arranged to form a stack of microelectronic devices, wherein adjacent first and second microelectronic devices in the stack each have device contacts exposed at a front surface, and have a rear surface remote from and opposite the front surface, the front surface of each of the first and second microelectronic devices being a surface furthest from the rear surface thereof in a direction of thickness of the assembly;
an interconnection element underlying the second microelectronic device, the interconnection element having a plurality of signal contacts; and
first and second signal conductors respectively connecting the device contacts of the first and second devices with the signal contacts, the first and second signal conductors having substantial portions of lengths thereof extending above and confronting substantial portions of the front surfaces of the respective first and second microelectronic devices,
wherein the rear surface of the first microelectronic device has at least one conductive feature thereon such that the rear surface serves as a conductive plane, wherein the rear surface of the first microelectronic device is spaced a predetermined first distance above, extends opposite and at least generally parallel to, and confronts the substantial portions of the lengths of the second signal conductors, such that a desired impedance is achieved for the second signal conductors,
wherein the rear surface of the first microelectronic device extends at least generally parallel to the substantial portions of the lengths of the second signal conductors that are at least 25% of the total lengths of the respective second signal conductors.

2. The microelectronic assembly of claim 1, wherein the substantial portions of the lengths of the second signal conductors are spaced a predetermined second distance above a portion of the front surface of the second microelectronic device extending confronting the substantial portions of the lengths of the second signal conductors, the second distance being greater than the first distance.

3. The microelectronic assembly of claim 1, wherein the first distance is about 30-70 microns.

4. The microelectronic assembly of claim 1, wherein the rear surface of the first device extends at least generally parallel to the substantial portions of the lengths of the second signal conductors that are at least one millimeter.

5. The microelectronic assembly of claim 1, wherein a distance between the substantial portions of the lengths of the second signal conductors and a portion of the rear surface of the first microelectronic device extending confronting the substantial portions of the lengths of the second signal conductors is equal to or smaller than a distance between the substantial portions of the lengths of the second signal conductors and a portion of the front surface of the second microelectronic device extending confronting the substantial portions of the lengths of the second signal conductors.

6. The microelectronic assembly of claim 1, wherein each of the first and second devices includes an exposed edge surface extending between the front and rear surfaces thereof, the assembly further comprising:
a conductive interconnector interconnecting the respective exposed edge surfaces of the first and second devices.

7. The microelectronic assembly of claim 6, wherein the interconnection element includes a reference contact connectable to a source of reference potential, and wherein the conductive interconnector is connected to the reference contact.

8. The microelectronic assembly of claim 6, wherein the conductive interconnector is a conductive paste.

9. The microelectronic assembly of claim 1 further comprising:
a reference conductive element having a rear surface spaced a predetermined second distance above, opposite to and confronting the substantial portions of the lengths of the first signal conductors, such that a desired impedance is achieved for the first signal conductors.

10. The microelectronic assembly of claim 9, wherein the reference conductive element has a front surface remote from the rear surface thereof and an exposed edge surface extending between the front and rear surfaces thereof, wherein each of the first and second devices includes an exposed edge surface extending between the front and rear surfaces thereof, the assembly further comprising:
a conductive interconnector interconnecting at least two exposed edge surfaces of the respective exposed edge surfaces of the first and second devices and the reference conductive element.

11. The microelectronic assembly of claim 10, wherein the interconnection element includes a reference contact connectable to a source of reference potential, and wherein the conductive interconnector is connected to the reference contact.

12. The microelectronic assembly of claim 9, wherein the reference conductive element includes semiconductor material.

13. The microelectronic assembly of claim 9, wherein the reference conductive element is a layer of metal.

14. The microelectronic assembly of claim 9 further comprising:
a conductor connecting the reference conductive element to a reference contact of the interconnection element connectable to a source of reference potential.

15. The microelectronic assembly of claim 1 further comprising:
a layer of metal at the rear surface of the first device.

16. The microelectronic assembly of claim 1 further comprising:
a support element in contact with the rear surface of the first device and spacing the first device above the substantial portions of the lengths of the second signal conductors the first distance.

17. The microelectronic assembly of claim 16, wherein the support element is in contact with the interconnection element.

18. The microelectronic assembly of claim 16, wherein the support element includes at least one of dielectric material and silicon.

19. The microelectronic assembly of claim 16, wherein the support element includes adhesive material.

20. The microelectronic assembly of claim 16, wherein the support element is in contact with the front surface of the second microelectronic device.

21. The microelectronic assembly of claim 20, wherein the support element includes a first portion including adhesive material and contacting the rear surface of the first microelectronic device, and a second portion including adhesive material and contacting the front surface of the second microelectronic device.

22. The microelectronic assembly of claim 21, wherein the support element includes a third portion disposed between the first and second portions.

23. The microelectronic assembly of claim 22, wherein the third portion includes at least one of silicon and polyimide.

24. The microelectronic assembly of claim 1, wherein each of the first and second devices has a first edge remote from a second edge, and wherein at least one of the device contacts of the first and second devices to which the first and second signal conductors are respectively connected is disposed centrally between the first and second remote edges of the respective device.

25. A system comprising an assembly according to claim 1 and one or more other electronic components electrically connected to the assembly.

26. A system as claimed in claim 25 further comprising a housing, the assembly and the other electronic components being mounted to the housing.

* * * * *